United States Patent
Doris et al.

(10) Patent No.: US 9,331,174 B2
(45) Date of Patent: *May 3, 2016

(54) METHOD FOR IMPROVING DEVICE PERFORMANCE USING EPITAXIALLY GROWN SILICON CARBON (SIC) OR SILICON-GERMANIUM (SIGE)

(75) Inventors: Bruce B. Doris, Yorktown Heights, NY (US); Johnathan E. Faltermeier, Albany, NY (US); Lahir M. Shaik Adam, Yorktown Heights, NY (US); Balasubramanian S. Pranatharthi Haran, Albany, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 637 days.

This patent is subject to a terminal disclaimer.

(21) Appl. No.: 12/760,688

(22) Filed: Apr. 15, 2010

(65) Prior Publication Data
US 2011/0254015 A1   Oct. 20, 2011

(51) Int. Cl.
| H01L 29/66 | (2006.01) |
| H01L 29/78 | (2006.01) |
| H01L 21/02 | (2006.01) |
| H01L 21/223 | (2006.01) |
| H01L 21/265 | (2006.01) |
| H01L 21/28 | (2006.01) |
| H01L 29/165 | (2006.01) |
| H01L 29/49 | (2006.01) |
| H01L 29/51 | (2006.01) |

(52) U.S. Cl.
CPC ...... *H01L 29/66636* (2013.01); *H01L 29/6659* (2013.01); *H01L 29/7848* (2013.01); *H01L 21/02576* (2013.01); *H01L 21/02579* (2013.01); *H01L 21/223* (2013.01); *H01L 21/26513* (2013.01); *H01L 21/26586* (2013.01); *H01L 21/2807* (2013.01); *H01L 29/165* (2013.01); *H01L 29/495* (2013.01); *H01L 29/4966* (2013.01); *H01L 29/517* (2013.01); *H01L 29/6656* (2013.01)

(58) Field of Classification Search
CPC .................................................. H01L 29/6656
USPC ............................................. 257/77; 438/303
See application file for complete search history.

(56) References Cited

U.S. PATENT DOCUMENTS

| 6,979,622 | B1 | 12/2005 | Thean et al. |
| 7,230,264 | B2 | 6/2007 | Thean et al. |
| 2005/0148142 | A1 | 7/2005 | Cabral et al. |
| 2006/0228842 | A1* | 10/2006 | Zhang et al. ............... 438/184 |
| 2006/0240630 | A1* | 10/2006 | Bauer et al. ................ 438/301 |
| 2007/0093033 | A1* | 4/2007 | Wang et al. ................ 438/303 |
| 2008/0006818 | A1* | 1/2008 | Luo et al. ..................... 257/19 |
| 2008/0067545 | A1* | 3/2008 | Rhee et al. .................. 257/190 |
| 2008/0166847 | A1* | 7/2008 | Utomo et al. ............... 438/301 |

* cited by examiner

*Primary Examiner* — William Harriston
(74) *Attorney, Agent, or Firm* — Robert Curcio; DeLio, Peterson & Curcio, LLC (57) ABSTRACT

A semiconductor substrate including a field effect transistor (FET) and a method of producing the same wherein a stressor is provided in a recess before the source/drain region is formed. The device has an increased carrier mobility in the channel region adjacent to the gate electrode.

20 Claims, 6 Drawing Sheets

METHOD FOR IMPROVING DEVICE PERFORMANCE USING EPITAXIALLY GROWN SILICON CARBON (SIC) OR SILICON-GERMANIUM (SIGE)

FIELD OF THE DISCLOSURE

The present disclosure relates to a semiconductor structure and a method of fabricating the same. More particularly, the present disclosure relates to a complementary metal oxide semiconductor (CMOS) structure having an improved carrier channel mobility.

BACKGROUND

Mechanical stresses within a semiconductor device substrate have been widely used to modulate device performance. For example, in common Si technology, the channel of a transistor is oriented along the {110} planes of silicon. In this arrangement, hole mobility is enhanced when the channel is under compressive stress in the primary direction of charge transport and/or under tensile stress in a direction normal of the channel, while the electron mobility is enhanced when the silicon film is under tensile stress in the primary direction of charge transport and/or under compressive stress in the direction normal to the primary direction of charge transport of the channel. Therefore, compressive and/or tensile stresses can be advantageously created in the channel regions of a p-channel field effect transistor (pFET) and/or an n-channel field effect transistor (nFET) to enhance the performance of such devices.

One possible approach for creating a desirable stressed silicon channel region is to form embedded Si:C or SiGe stressors (i.e., stress wells) at the source and drain regions of a CMOS device to induce compressive or tensile strain in the channel region located between the source and drain regions. Although embedded stressor technology is now well-known, the integration of the embedded stressor into the normal CMOS process flow is extremely challenging. The extent of the performance of the CMOS device depends strongly on the stress generated by the embedded stressor itself, the active dopant concentration in the embedded stressor and the proximity of the embedded stressor to the device channel region.

Despite these advances in the semiconductor industry, further improvement in embedded stressor technology is needed that provides a good balance between stressor proximity and short channels effects. A disadvantage of the stressors of the related art is that they are located relatively far away from the channel. Moreover, an embedded stressor technology is needed that also eliminates possible defect generation, which typically occurs during the ion implantation of deep source/drain regions in embedded stressor technology of the related art. However, this approach does not maximize the extent of performance gain that can be achieved.

SUMMARY OF THE DISCLOSURE

The channel mobility can be further improved by providing a channel stressor that is located closer to the channel. As described in detail below, provided herein is a semiconductor structure and a method of fabricating the same wherein the channel stressor is an eptaxially grown layer that is selectively formed in a recess region of a transistor gate structure.

In a typical embodiment, the semiconductor structure comprises a transistor gate structure, an epitaxially grown extension region abutting the transistor gate structure, a source region abutting the epitaxially grown extension region at a first region, and a drain region abutting the epitaxially grown extension region at a second region. Further, the preferred method of fabricating the semiconductor structure comprises providing a semiconductor substrate, forming a gate structure on the semiconductor substrate, forming an offset spacer abutting the gate structure, forming a recess in the semiconductor substrate adjacent to the offset spacer, epitaxially growing an extension region in the recess, forming a source/drain spacer abutting the offset spacer and the extension region, and forming a source region or a drain region abutting the extension region.

Silicon carbide (SiC) or silicon-germanium (SiGe) is selectively introduced as a stressor into an extension region in close proximity to the gate structure to increase the semiconductor device performance by increasing the carrier mobility. This approach also minimizes short channel effects of the transistor so formed because the extension regions are better defined spatially because of a more abrupt transition between the extension region and the channel region. Moreover, the deposition time for the extension region can be made shorter than the deposition times of the stress wells of the related art. As a consequence, subsequent high temperature annealing and concurrent or subsequent dopant implementation can be shortened resulting in minimization of transient effects associated with high temperature annealing or implant damage in conventional implant based doping methods.

BRIEF DESCRIPTION OF THE DRAWINGS

The foregoing and other objects, aspects and advantages will be better understood from the following detailed description of the best and various embodiments with reference to the drawings, in which.

DESCRIPTION OF THE BEST AND VARIOUS EMBODIMENTS

Figure 1:
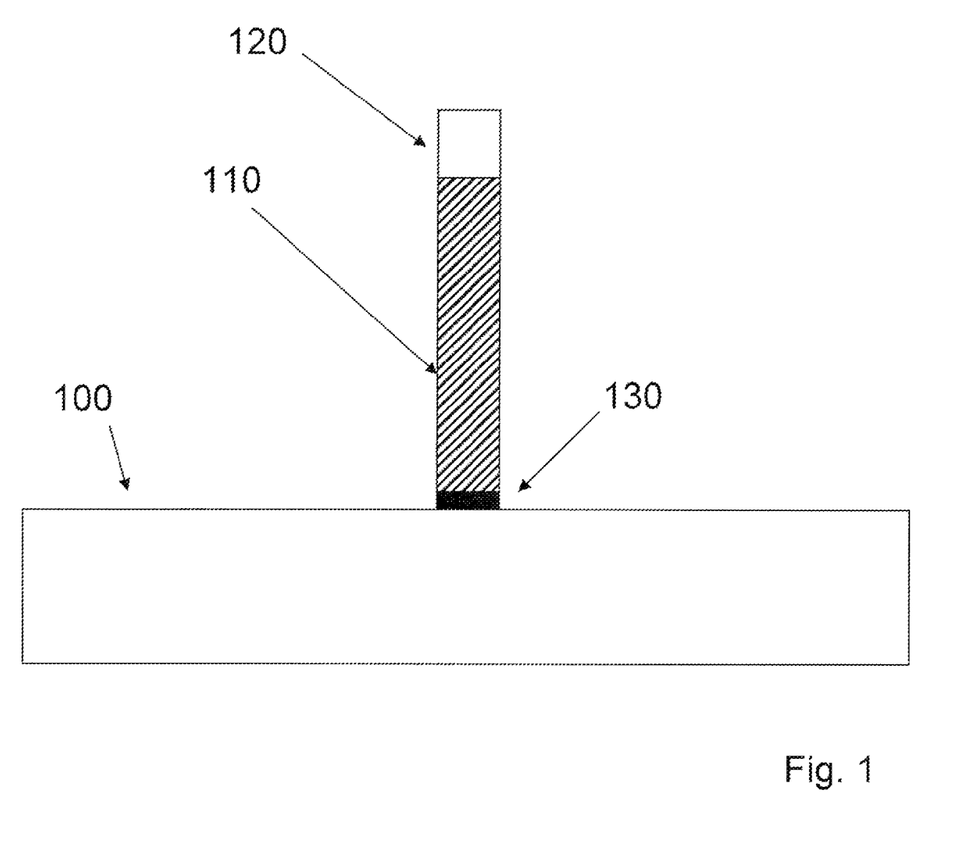
FIG. 1 shows a gate structure with a hardmask for forming field effect transistors (FETs) with laterally thin extensions according to a preferred embodiment of the present disclosure.

Turning to the drawings, FIG. 1 shows an early processing step in the formation of a field effect transistors (FETs), which is a preferred embodiment of this application. In particular, FIG. 1 shows a laterally thin extensions of a gate electrode 110 formed on a semiconductor substrate 100. Gate electrode 110 further comprises a hardmask 120 on the side opposite to the side at which gate electrode 110 is attached to the semiconductor substrate 100. Gate electrode 110 is obtained by patterning on the semiconductor substrate. Preferably, the semiconductor substrate is silicon based, e.g., silicon, a silicon alloy, or a combination thereof including Si, SiGe, SiC, and SiGeC.

However, any suitable semiconductor material may be used including, but not limited to GaAs, InAs, InP or other III/V compound semiconductors. The semiconductor substrate may also include a multilayer structure in which at least the top layer thereof is a semiconductor. Illustrative examples of multilayer substrate structures include, for example, Si/SiGe, a silicon-on-insulator (SOI) or a SiGe-on-insulator (SGOI). The semiconductor substrate may also include a gate dielectric located on a surface of a semiconductor material and a gate electrode material (or gate material) located on the gate dielectric. The semiconductor substrate may also include various useful structures such as memory cells, isolation structures (e.g. isolation trenches), dopant wells, locally stressed regions, three dimensional transistor features such as fins and pillars, and buried contacts and interconnects.

The gate dielectric 130 is formed on the surface of a semiconductor material using a suitable formation step such as for example, depositing the dielectric, a thermal oxidation, nitridation or oxynitridation. Combinations of the aforementioned processes may also be used in forming the gate dielectric. The gate dielectric 130 is an insulating material including an oxide, nitride, oxynitride or any combination thereof. A highly preferred insulating material that may be employed as the gate dielectric is nitrided $SiO_2$ or oxynitride. Although it is preferred to use nitrided $SiO_2$ or oxynitride as the gate dielectric material, the present disclosure also contemplates using insulating materials, i.e., dielectrics, which have a higher dielectric constant, k, than nitrided $SiO_2$. For example, the gate dielectric may include a oxynitride-nitride stack, a pure nitride, a high-k oxide or oxynitride or respective silicate such as $Al_2O_3$, $HfO_2$, $HfO_xN_y$, $HfSi_xO_yN_z$. The physical thickness of the gate dielectric may vary, but typically the gate dielectric has a thickness of from about 0.5 to about 20 nanometer (nm), with a thickness of from about 1.0 to about 3.0 nanometer being more highly preferred.

Preferably, the gate material for gate electrode 110 is doped polysilicon. However, any suitable conductive material such as an alloy of doped silicon, for example, silicon-germanium (SiGe) or silicon-carbon (SiC) and/or other conductive materials including elemental metals (W, Ta, Mo, Ti, Re, Ir, Al, etc.), metal silicides ($CoSi_x$, $NiSi_x$, $WSi_x$, $TiSi_x$), metal nitrides (WN, TaN, TiN) and its alloys is a suitable material for the gate electrode. Further, the gate electrode material can be in either crystalline, polycrystalline, or amorphous form and may include multiple layers of various conducting materials.

The gate electrode material is patterned to form narrow transistor gates. As referred to herein, a narrow gate refers to the smallest geometrical feature of the gate. The patterning step is typically accomplished using well known photolithography techniques. A reactive ion etch (RIE) is typically employed to complete photolithography pattern transfer into the gate. The RIE is highly selective to the particular choice of gate insulator to stop on it. After gate etch, a hardmask 120 is provided at the end of gate electrode that is not attached to the semiconductor substrate. Hardmask 120 is formed by first forming a conformal layer of a material by thermal oxidation, nitridation or known deposition methods with subsequent directional RIE etch. Optionally, the halo regions are formed, e.g., using a halo implant and optional anneal. Hardmask 120 remains on the gate electrode 110 for further processing.

A hardmask 120 is introduced in the patterning process and remains on the gate electrode 110 to protect the electrode in subsequent processing steps. Hardmask 120 may be a silicon nitride layer, but other hardmask materials know in the art are also suitable. In one example, a thin silicon nitride layer is first disposed over the entire substrate. Then, a photoresist (PR) based mask opens desired areas and blocks other regions to create at least one gate electrode. A removal step is then performed to form a narrow gate electrode while removing the semiconductor material in other areas. After photoresist strip, the semiconductor has a narrow gate electrode covered with hardmask 120.

Figure 2:
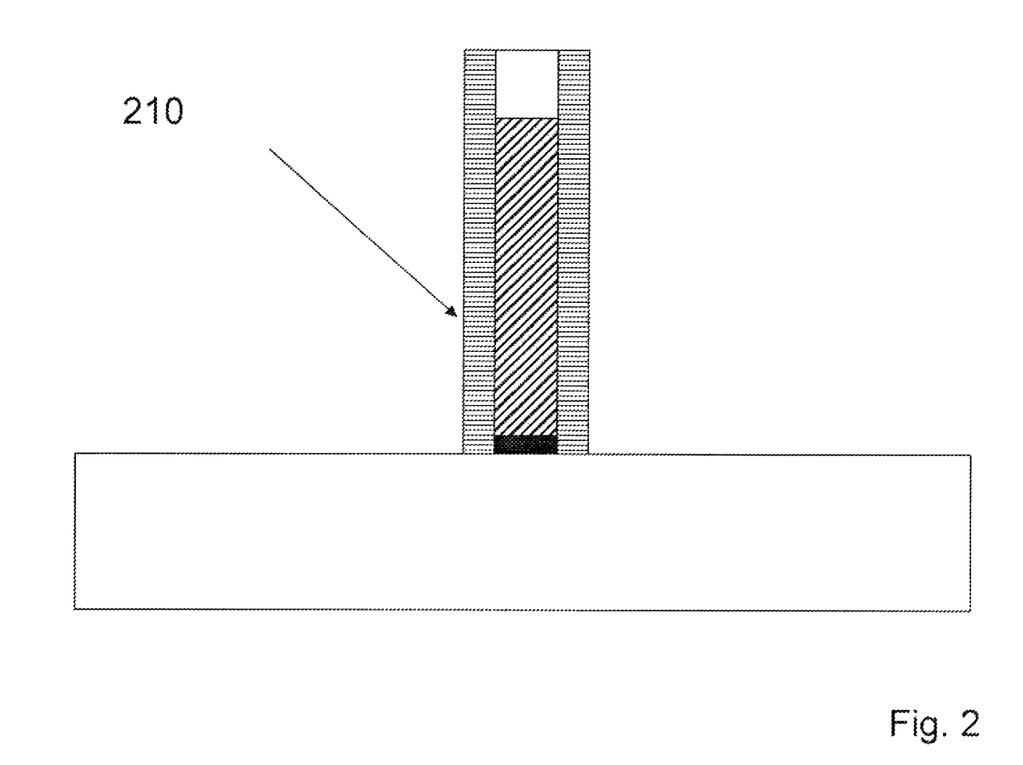
FIG. 2 shows an offset spacer being formed abutting the gate structure.

FIG. 2 depicts offset spacers being formed abutting the gate electrode 110 and the hardmask 120.

Figure 3:
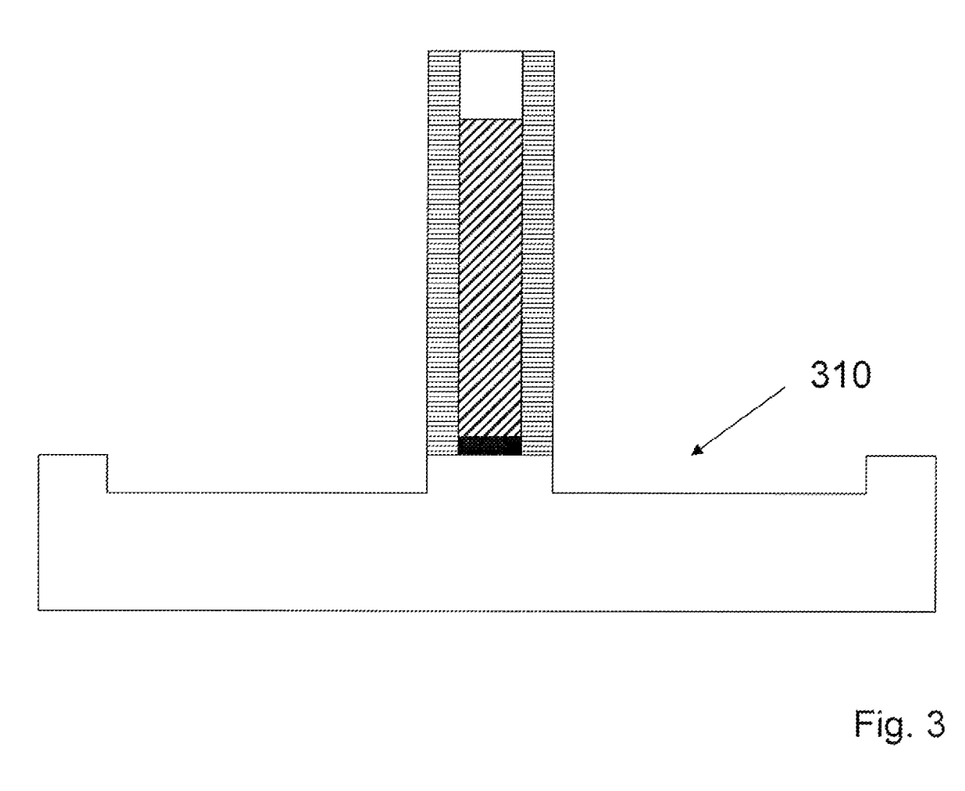
FIG. 3 shows a recess being formed in the silicon substrate in close proximity to the gate structure.

Next, FIG. 3. depicts recess 310 being formed in the surface of the semiconductor substrate 100 by selectively etching a region adjacent to the offset spacer 210 in areas not protected by gate electrodes and adjacent spacers.

Figure 4:
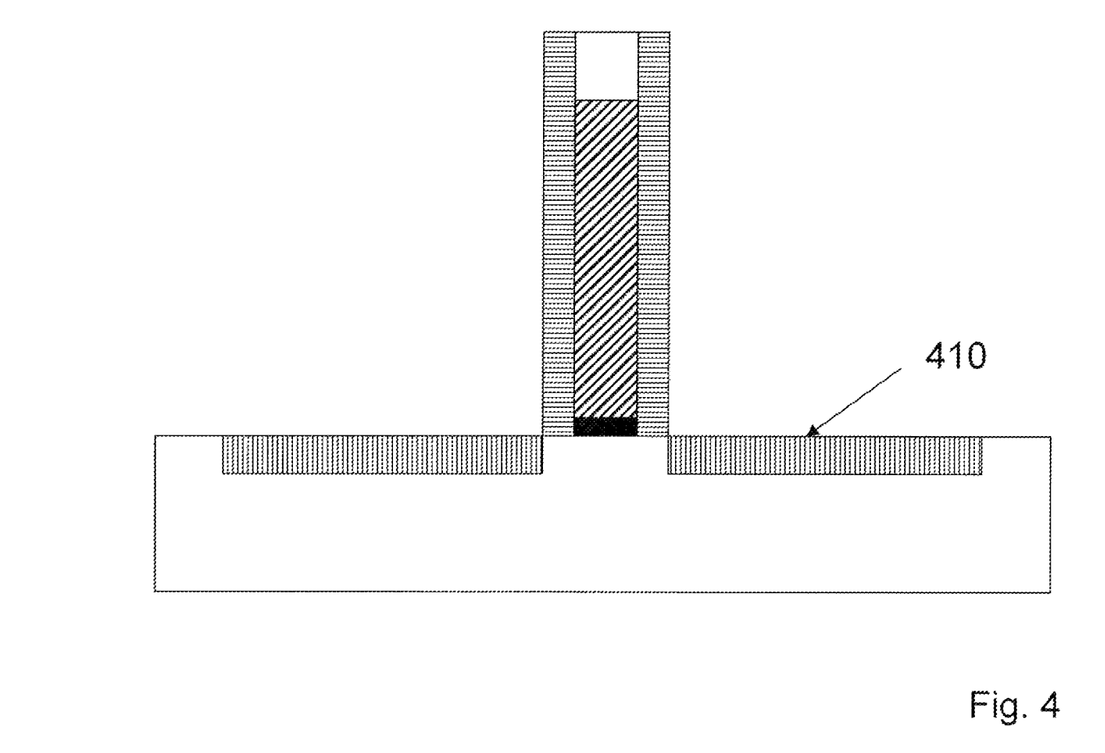
FIG. 4 shows an eptaxially grown SiC or SiGe extension region being formed within a recess, which may optionally be doped with a dopant.

FIG. 4 depicts an extension region 410 being formed in recess 310 by epitaxial growth. The epitaxially grown extension region material can be selected from any suitable semiconducting material, wherein SiC and SiGe are preferred and SiC is particularly preferred. The height of the epitaxially grown extension region 410 is preferably of from 5 to 30 nanometers and particularly preferably of from 5 to 15 nanometers. The deposition temperature for epitaxially growing the extension region 410 is of from 400° C. to 1,000° C. and requires a deposition time of approximately 70 minutes.

The epitaxially grown extension region 410 can optionally be doped using known doping techniques, such as gas phase doping. The doping may be performed subsequently to the formation of epitaxially grown extension region 410 or by in-situ doping. Both n-type doping and p-type doping may be performed. Preferred dopant for n-type doping are arsenic and phosphorous and a preferred dopant for p-type doping is boron.

Alternatively, doping is performed in-situ during the epitaxial growth. Silicon epitaxy is well known in the art. Preferably, the in-situ doped epi layer is grown from a silicon tetrachloride or silane ($SiH_4$) gas mixtures at 400-900° C. in the presence of a suitable dopant gases, such as diborane ($B_2H_6$) gas for p-type boron dopant or phosphine ($PH_3$) or arsine ($AsH_3$) gas for n-type phosphorus and/or arsine dopants. Alternatively, the growth source may be a mixture of dichlorosilane and hydrochloric acid instead of silicon tetrachloride. So, for a typical CMOS IC, for example, pFET device regions are masked using a hard mask and in-situ n-type doped epi is grown in nFET extension regions; and, then, nFET devices are masked using a hard mask and in-situ p-type doped epi is similarly grown in pFET extension regions. So, first in this example, a hardmask layer such as an oxide layer or a nitride layer is formed over the semiconductor structure and pFET device areas are masked lithographically, while exposing nFET areas. One example of such mask is a thin layer of silicon nitride. Such hardmasks can be easily and selectively etched using a solution of heated phosphoric acid. Of course, it is understood that alternatively pFETs may be formed first, followed by nFET formation.

Figure 5:
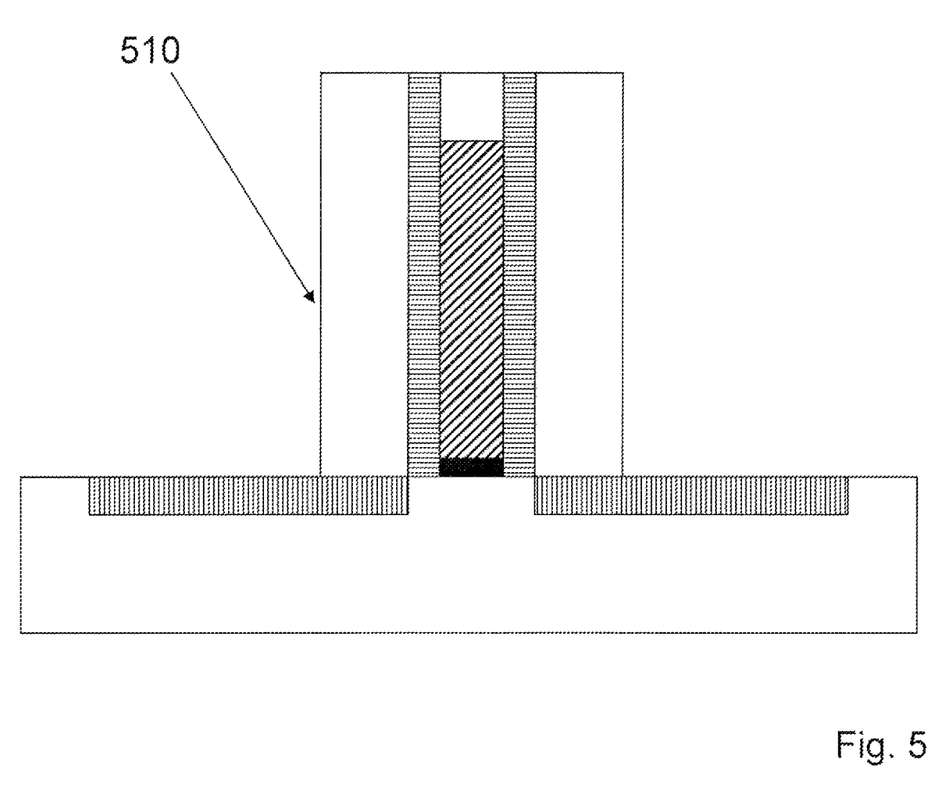
FIG. 5 shows a source/drain (S/D) spacer being formed adjacent to the offset spacer.

FIG. 5 depicts the formation of source/drain spacer 510 abutting offset spacer 210. A thin layer is formed over the offset spacer and the gate electrode 110 including the hardmask 120. The thin layer may be a nitride spacer. The thin spacer becomes source/drain spacer 510 after a top portion is removed from the hardmask 120 by a dry etch.

Figure 6:
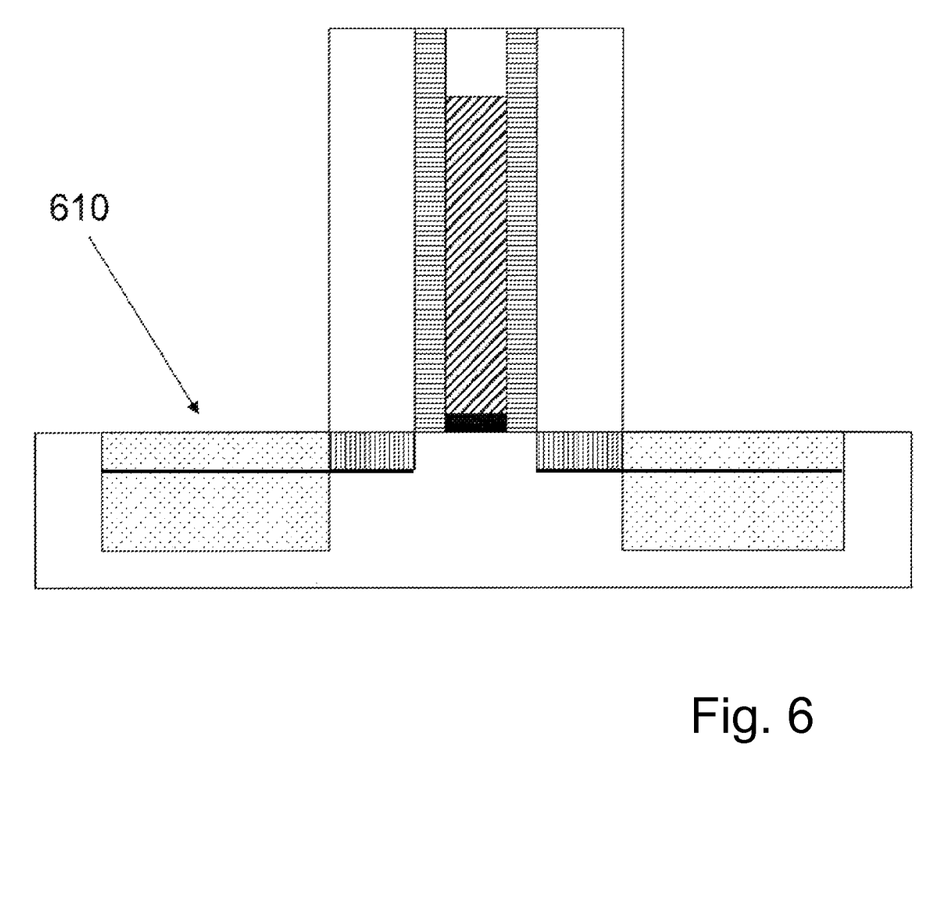
FIG. 6 shows an eptaxially grown source/drain being formed within the silicon substrate.

FIG. 6 depicts the formation of source/drain region 610 on semiconductor substrate 100 and adjacent to source/drain spacer 510.

After forming the source/drain region, an optional dopant implant step can be performed to increase the depth of doped region in source/drain regions. The purpose of this optional implant is to reduce resistance to the electrical current flow from the silicide to the laterally thin extensions. Further, an optional anneal or a combination of anneals can be conducted before and/or after the optional implant to further activate the dopants in the laterally thin extension and in the implanted layer and to heal any damage caused the implant. Optional activation anneal(s) can be performed for ultra short time of less than several milliseconds and, preferably, for hundreds of microseconds to prevent excessive diffusion of dopants. Such ultra short activation anneals are well known in the art as laser or flash anneals. Additionally, optional implant damage healing anneal(s) can performed in a regular rapid thermal processor (RTP) reactor at a relatively low temperature to prevent excessive diffusion of dopants.

Subsequently, device processing continues through typical semiconductor manufacturing middle of the line (MOL) and back end of the line (BEOL) processing steps to form integrated circuit (IC) chips. Preferably, the MOL and BEOL processes are conducted at low temperature to prevent uncontrollable reactions. For example, in advanced CMOS fabrication, all MOL and BEOL processes may be conducted at or below about 400° C.

Typically, MOL processing steps may include: removing the thin spacer; forming of additional spacers around the gates; forming additional conductive areas away from the gate using low resistance material (e.g. silicide); forming insulating and encapsulating liners around entire transistor structure; and various gate replacement schemes. Although these MOL process steps may considerably change the spacer structure, the gate composition, and the source/drain structure, a preferred embodiment thin source/drain extension with adjacent highly conductive material and appurtenant transistor channel remains substantially the same.

It should be noted that n-type FETs (NFETs) and p-type FETs (PFETs) are formed substantially identically in any order with device terminals and regions being doped with a suitable dopant for the particular device type. In one implant step, the particular dopant is implanted at the device regions using a halo implant to control device short channel $V_T$ rolloff. Other device implant steps include well definition implants including $V_T$ adjust implants and optional deep source drain implants. Preferably and depending upon device type, a $10^{13}$-$10^{14}$/cm$^2$ dose of arsenic (As), boron (B), boron difluoride (BF$_2$) or phosphorous (P) is implanted at a tilt angle of about 10 to about 30 degrees with a halo energy of about 1 to about 100 KeV. Preferably, the halo dopant is activated with a 50 microsecond to 10 second anneal at about 900 to about 1410° C. The boron (B) can be provided by beamline implantation with elemental boron or a BF$_2$ dopant species or by providing BF$_3$ by plasma implantation.

Before forming the source/drain region an optional anneal or a combination of anneals can be conducted before and/or after the optional implants to further activate the dopants in the laterally thin extension and in the implanted layer and to heal any damage caused the implant. The optional activation anneal(s) can performed for ultra short time of less than several milliseconds and, preferably, for hundreds of microseconds to prevent excessive diffusion of dopants. Such ultra short activation anneals are known in the art as laser or flash anneals. The optional implant damage healing anneal(s) can be performed in a regular rapid thermal processor (RTP) reactor at a relatively low temperature to prevent excessive diffusion of dopants.

In one embodiment, the gas phase doping step is conducted in the gas ambient, with dopant gases such arsine (AsH$_3$) and phosphine (PH$_3$) for n-type As or P, respectively; and, diborane (B$_2$H$_6$) gas for p-type boron. A typical temperature of the gas phase doping process is from about 500° C. to about 1100° C. A typical duration of the gas phase doping process is from about 1 second to about 1 hour depending on the desired diffusion length. Normally, one would select a relatively high process temperature and short process time to introduce high concentration of dopants ($5 \cdot 10^{18}$ cm$^{-3}$ to about $10^{19}$ cm$^{-3}$) within a thin surface layer and sharp profile. Prior to the gas phase doping, the surface of semiconductor is cleaned to remove any material present on exposed surfaces (e.g. native oxide in the case of silicon semiconductor). The cleaning step may include hydrofluoric acid based wet clean, a semiconductor surface passivation with easily removable absorbent step, and/or an in-situ bake in a reducing atmosphere (e.g. H$_2$) at reduced pressure. Because of high processing temperature, a typical photoresist (PR) based block masks employed to selectively introduce different types of dopants into nFET and pFET cannot be used at this step.

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

The foregoing description of the disclosure illustrates and describes the present disclosure. Additionally, the disclosure shows and describes only the preferred embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

What is claimed is:

1. A semiconductor structure comprising:
   a semiconductor substrate;
   a transistor gate electrode at the surface of said semiconductor substrate;
   a gate dielectric on said surface of the semiconductor substrate beneath the transistor gate electrode, said gate dielectric having a thickness from about 0.5 to about 20 nanometers;
   an offset spacer abutting the transistor gate electrode at each end of the transistor gate;
   a recess in said surface at said each end;
   an epi layer of doped silicon germanium (SiGe) or silicon carbide (SiC), said epi layer epitaxially grown in, and filling, each said recess to said surface;
   a source/drain spacer on an end of said epi layer at said surface abutting said offset spacer at said each end;
   a source/drain extension under each said source/drain spacer, the portion of a respective said epi layer under said each source/drain spacer forming each said source/drain extension; and
   a source/drain diffusion region formed in said epi layer and said recess at said each source/drain extension, wherein the source/drain spacers above said each source/drain extension delimit said source/drain regions.

2. The semiconductor structure according to claim 1, wherein the epi layer is n-doped.

3. The semiconductor structure according to claim 1, wherein the epi layer is p-doped.

4. The semiconductor structure according to claim 1, wherein the epi layer has a thickness of from 5 to 30 nm.

5. The semiconductor structure according to claim 1, wherein the epi layer has a thickness of from 5 to 15 nm.

6. The semiconductor structure according to claim 1, wherein the epi layer is a SiC layer with a carbon content of from 0.5 to 5% by weight based on the weight of the SiC layer.

7. The semiconductor structure according to claim 1, wherein the gate dielectric is an insulating material selected from an oxide, nitride, or oxynitride.

8. The semiconductor structure according to claim 1, wherein the gate dielectric is nitride $SiO_2$ or oxynitride.

9. The semiconductor structure according to claim 1, wherein the transistor gate electrode comprises doped silicon.

10. The semiconductor structure according to claim 1, wherein the semiconductor substrate comprises silicon, SiGe, SiC, SiGeC, or a combination thereof.

11. The semiconductor structure according to claim 1, wherein the semiconductor substrate is a silicon-on-silicon substrate.

12. A semiconductor structure comprising:
a semiconductor substrate;
a transistor gate electrode at the surface of said semiconductor substrate;
an offset spacer abutting the transistor gate electrode at each end of the transistor gate;
a recess in said surface at said each end;
an epi layer of doped silicon carbide (SiC) with a carbon content of from 0.5 to 5% by weight based on the weight of the epi layer, said epi layer epitaxially grown in, and filling, each said recess to said surface;
a source/drain spacer on an end of said epi layer at said surface abutting said offset spacer at said each end;
a source/drain extension under each said source/drain spacer, the portion of a respective said epi layer under said each source/drain spacer forming each said source/drain extension; and
a source/drain diffusion region formed in said epi layer and said recess at said each source/drain extension, wherein the source/drain spacers above said each source/drain extension delimit said source/drain regions.

13. The semiconductor structure according to claim 12, wherein the epi layer has a thickness of from 5 to 30 nm.

14. The semiconductor structure according to claim 12, wherein the epi layer has a thickness of from 5 to 15 nm.

15. The semiconductor structure according to claim 12, further comprising a gate dielectric on said surface of the semiconductor substrate beneath the transistor gate electrode.

16. The semiconductor structure according to claim 15, wherein the gate dielectric is an insulating material selected from an oxide, nitride, or oxynitride.

17. The semiconductor structure according to claim 15, wherein the gate dielectric is nitride $SiO_2$ or oxynitride.

18. The semiconductor structure according to claim 15, wherein the transistor gate electrode comprises doped silicon.

19. The semiconductor structure according to claim 15, wherein the semiconductor substrate comprises silicon, SiGe, SiC, SiGeC, or a combination thereof.

20. The semiconductor structure according to claim 15, wherein the semiconductor substrate is a silicon-on-silicon substrate.

* * * * *